United States Patent [19]
Lee et al.

[11] Patent Number: 5,920,503
[45] Date of Patent: Jul. 6, 1999

[54] FLASH MEMORY WITH NOVEL BITLINE DECODER AND SOURCELINE LATCH

[75] Inventors: Peter W. Lee, Saratoga, Calif.; Fu-Chang Hsu; Hsing-Ya Tsao, both of Taipei, Taiwan

[73] Assignee: Aplus Flash Technology, Inc., Santa Clara, Calif.

[21] Appl. No.: 08/850,489

[22] Filed: May 2, 1997

Related U.S. Application Data

[63] Continuation-in-part of application No. 08/624,322, Mar. 29, 1996, Pat. No. 5,646,890, and a continuation-in-part of application No. 08/645,630, May 14, 1996, Pat. No. 5,687,121, and a continuation-in-part of application No. 08/691,281, Aug. 1, 1996, Pat. No. 5,796,657.

[51] Int. Cl.$^6$ .................................................. G11C 16/00
[52] U.S. Cl. .............................. 365/185.11; 365/185.29; 365/185.26
[58] Field of Search .......................... 365/185.11, 185.18, 365/185.23, 185.26, 185.29, 185.33

[56] References Cited

U.S. PATENT DOCUMENTS

| | | | |
|---|---|---|---|
| 5,245,572 | 9/1993 | Kosonocky et al. ................ | 365/185.11 |
| 5,327,384 | 7/1994 | Ninomiya .......................... | 365/185.11 |
| 5,414,669 | 5/1995 | Tedrow et al. ..................... | 365/185.29 |
| 5,541,886 | 7/1996 | Hasbun .............................. | 365/185.11 |
| 5,555,521 | 9/1996 | Hamada et al. .................... | 365/185.29 |

*Primary Examiner*—Tan T. Nguyen
*Attorney, Agent, or Firm*—Flehr Hohbach Test Albritton & Herbert LLP

[57] ABSTRACT

A flash memory with a novel bitline and sourceline decoder includes a first bank of flash transistors forming a plurality of rows and a plurality of columns, and having wordlines, bitlines and a first sourceline. A second bank of flash transistors forms a plurality of rows and a plurality of columns, and has wordlines, bitlines and a second sourceline. A wordline decoder is coupled to the wordlines and configured to receive a wordline address signal and to decode the wordline address signal to select a wordline. A bitline and sourceline decoder is coupled to the bitlines and sourcelines and configured to receive a bitline address signal and to decode the bitline address signal to select predetermined bitlines and sourcelines. The bitline and sourceline decoder includes a latch coupled to the bitlines, the first sourceline and the second sourceline and configured to latch selected bitlines and sourcelines to selectively provide erase voltages on the selected bitlines and sourcelines. As a result of the novel memory architecture, a flexible number of bytes can be selected for erasure. The selected number of bytes can range from one byte to 64K bytes or more. Advantages of the invention include reduced erase/write cycle time and an improved expected lifetime of the flash memory due to reduced stress on the flash transistors within the flash memory.

20 Claims, 13 Drawing Sheets

| | ERSB | READ | SCANB |
|---|---|---|---|
| SET | VDD | GND | VDD |
| RESET | VDD | GND | GND |
| ERASE | GND | GND | X |
| SCAN | VDD | GND | GND |
| READ | VDD | VDD | VDD |

TABLE 1

FLASH MEMORY WITH NOVEL BITLINE DECODER AND SOURCELINE LATCH

REFERENCE TO RELATED APPLICATIONS

This application is a continuation-in-part of U.S. Ser. No. 08/624,322 filed on Mar. 29, 1996 (Atty Docket No. A-62384) now U.S. Pat. No. 5,646,890; U.S. Ser. No. 08/645,630 filed on May 14, 1996 (Atty Docket No. A-63360) now U.S. Pat. No. 5,687,121; and U.S. Ser. No. 08/691,281 filed on Aug. 1, 1996 (Atty Docket No. A-63645) now U.S. Pat. No. 5,796,657 all incorporated herein by reference.

FIELD

The present invention relates t o a flash memory with a novel bitline and sourceline decoder. In particular, the bitline and sourceline decoder provides a mechanism for activating selected bitlines and sourcelines and latching selected bitlines and sourcelines to apply predetermined voltages to selected portions of the memory.

BACKGROUND

Flash memories are becoming increasingly popular. However, some persistent drawbacks exist with conventional flash memories. For example, many conventional flash memories employ a large block erase limitation that is capable of erasing no less than a block of the memory at a time and re-programming the entire block with new data, even if only a small portion of the block needs to be re-programmed. Due to this relatively large re-programmning technique, conventional flash memories are slow to respond and cannot achieve a large number of erase/program cycles due to the stress on the memory cells inherent in the erasing and programming cycles.

One known flash memory has a limitation that it must erase the entire memory array or at least large block of approximately 64K bytes any time that a portion of memory needs to be re-programmed. A second known flash memory provides smaller page-erase feature that can typically erase and re-program 512 or 128 bytes at a time. Although the page-erase feature provides a smaller erase size, it still does not provide a high level of erase selectivity that is desired in order to promote fast operation and to reduce power consumption.

A second limitation of known flash memories is a low expected lifetime. Erasing and re-programming the memory stresses the transistors. Since known techniques erase and re-program large blocks of memory, all the transistors in the block are stressed. Over time, the stress reduces the flash memory life. For example, it is very difficult to build a flash memory that can survive $10^6$ erase/program cycles due to the stress on a large block of memory every time any portion of the block needs to be modified. Therefore, a method of reducing stress in a flash memory is an important development.

A goal of the invention is to overcome the identified problems and to provide a new technique to select a flexible portion of memory to be erased. In an exemplary embodiment, the minimum erase size is a portion of a word (e.g. a byte). The invention provides that unnecessary erase/program cycles are not performed on the deselected cells. As a result, a the invention can provide a large number of operable erase/program cycles, such as $10^6$ write/erase cycles, in a flash memory.

SUMMARY

The invention overcomes the identified problems and provides a flash memory with a novel bitline and sourceline decoder and latch that provides fast operation, less power consumption, long life and a flexible and random erase size from one byte to 64K bytes or more. A flash memory according to an embodiment of the invention includes a first bank of flash transistors forming a plurality of rows and a plurality of columns, and having wordlines, bitlines and a first sourceline. A second bank of flash transistors forms a plurality of rows and a plurality of columns, and has wordlines, bitlines and a second sourceline. A wordline decoder is coupled to the wordlines and configured to receive a wordline address signal and to decode the wordline address signal to select a wordline. A bitline and sourceline decoder is coupled to the bitlines and sourcelines and configured to receive a bitline address signal and to decode the bitline address signal to select predetermined bitlines and sourcelines. The bitline and sourceline decoder includes a latch coupled to the bitlines, the first sourceline and the second sourceline and configured to latch selected bitlines and sourcelines to selectively provide erase voltages on the selected bitlines and sourcelines.

In another embodiment the first bank of flash transistors includes a plurality of sub-banks that are individually selectable by the bitline and sourceline decoder. Each of the sub-banks has a separate sourceline that can be individually selected and latched by the bitline and sourceline decoder and latch. In one aspect of the sub-banks, they each store an individual word or group of words. In another aspect of the sub-banks, they each store a partial word and are combined as logical banks to form a word or group of words.

The exemplary embodiments can be combined with a voltage pump generator. A voltage pump generator provides operational voltages that are derived from the supplied voltages. For example, if the memory is supplied with +3 V, and needs +10 V for a program function, the voltage pump generator creates the required voltage and provides it to the decoder circuits to accomplish the necessary function. Likewise, the voltage pump can provide a negative voltage to the decoder circuits for the erase function.

As a result of the novel memory architecture, a flexible number of bytes can be selected for erasure. The selected number of bytes can range from one byte to 64K bytes or more. Advantages of the invention include reduced erase/write cycle time and an improved expected lifetime of the flash memory due to reduced stress on the flash transistors within the flash memory.

BRIEF DESCRIPTION OF THE FIGURES

Additional advantages of the invention will become apparent upon reading the following detailed description and upon reference to the drawings, in which.

DETAILED DESCRIPTION

Figure 1:
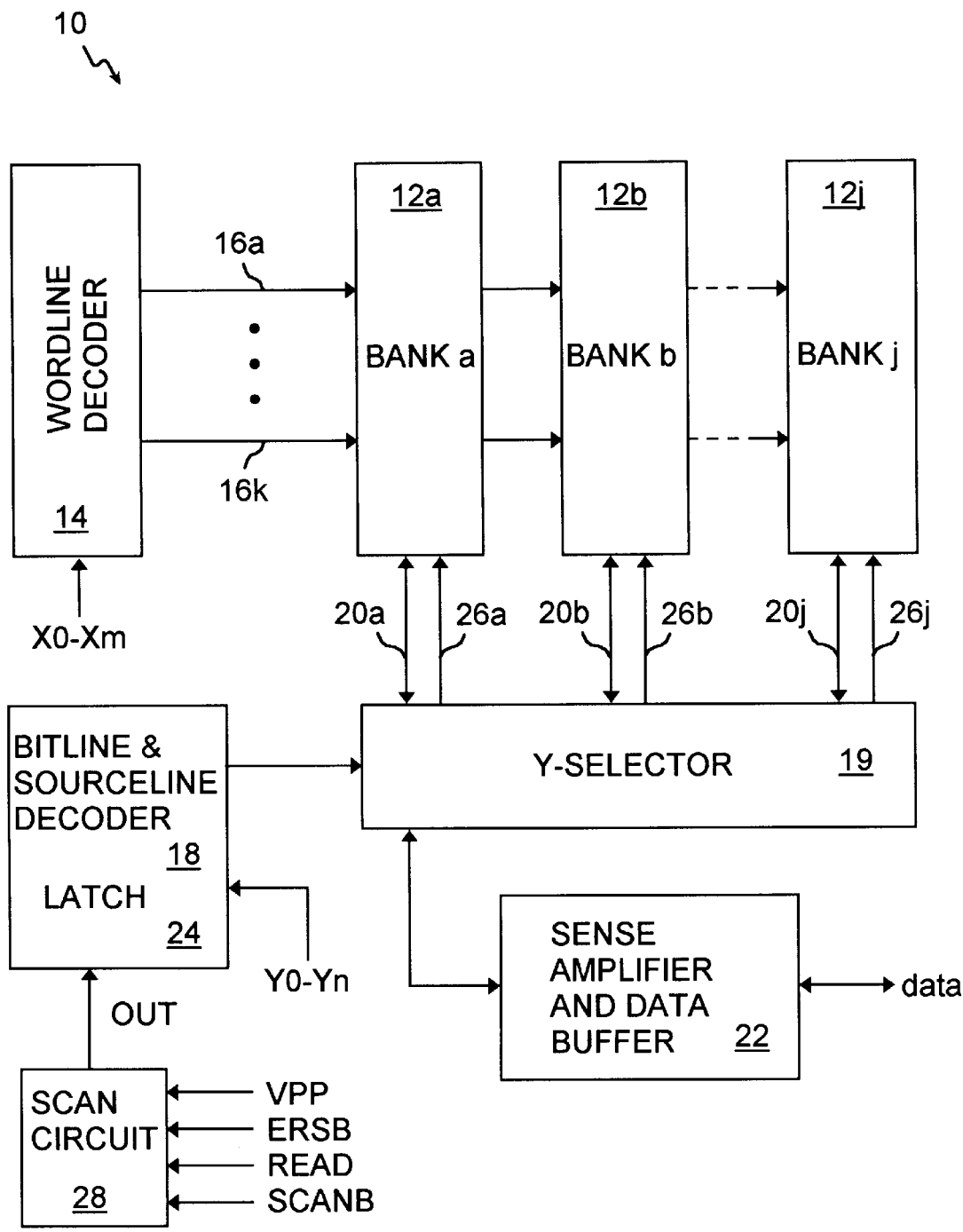
FIG. 1 depicts a multi-bank flash memory according to an embodiment of the invention.

Exemplary embodiments are described with reference to specific configurations. Those skilled in the art will appreciate that various changes and modifications can be made while remaining within the scope of the claims. All electrical parameters are given by example and can be modified with good results.

A. Flash Memory Architecture

A first embodiment is described with reference to FIG. 1. A flash memory 10 includes a plurality of banks 12a–12j that store information. Each bank is constructed similar to a traditional flash transistor array, with rows and columns of flash transistors. Each bank has wordlines, bitlines and a sourceline. This architecture has the feature of a divided sourceline, which allows for individual selection of the sourcelines.

A wordline decoder 14 is coupled to each of the banks 12a–12j. Wordline decoder 14 receives an address input X0–Xm and decodes the X0–Xm input to activate a wordline 16a–16k. Ordinarily, wordline 16a–16k includes a plurality of wordlines (WL0–WLk) where k is a 2 raised to the power m. That is, a design using 4 address lines X0–X3 will provide 16 wordlines WL0–WL15. When wordline decoder 14 is addressed by X0–Xm, a corresponding wordline WL0–WLk is activated. A more detailed description of an exemplary wordline decoder can be found in U.S. Ser. No. 08/645,630 filed on May 14, 1996 (Atty Docket No. A-63360).

A bitline and sourceline decoder 18 is also coupled to each of the banks 12a–12j. Bitline and sourceline decoder 18 receives an address input Y0–Yn and decodes the Y0–Yn input to couple selected bitlines 20a–20j from a selected bank, via Y selector 19, to sense amplifier and data buffer 22, and to couple selected sourcelines 26a–26j from a common sourceline, via Y selector 19, to a selected bank sourceline. This architecture is called a divided sourceline, which allows for individual selection of the sourcelines. Ordinarily, to the selected bitlines 20a–20j each include a plurality of bitlines (e.g. 20al–20aq to 20jl–20jq) where q is a predetermined number of bits such as 8 bits, 16 bits, 32 bits or other number of bits that represents a word or a portion of a word to a processor. When the selection is made, bitline and sourceline decoder 18 couples the selected bitlines to sense amplifier 22, which converts the sensed signal to data for output. The data buffer portion of sense amplifier and data buffer 22 is used primarily for incoming data that needs to be programmed into the memory. The Y selector 19 is described below and shown in greater detail in FIGS. 5–8. In an alternate embodiment, bitline and sourceline decoder 18 includes the structure of Y selector 19.

The bitline and sourceline decoder 18 also includes a latch 24. When the bitlines and sourcelines are desired to be latched, the latch 24 is responsible for latching selected bitlines 20a–20j and selected sourcelines 26a–26j in order to provide operational voltages to the flash memory banks. In the exemplary embodiments, the bitline and sourceline decoder controls the latch function. The bitline and sourceline decoder includes the selection circuit to determine which sourceline is selected. A scan circuit 28 is also coupled to the bitline and sourceline decoder and is configured to scan the latch in order to selectively identify set latches during a procedure verification. The bitline and sourceline decoder is also configured to selectively reset the latches after a procedure verification or during a read procedure.

In the exemplary embodiments, both wordline decoder 14 and bitline and sourceline decoder 18 are provided with all the operational voltages VNN (−10V), VSS (ground), VDD (+5 V) and VPP (+10 V). This enables the decoders to provide operational voltages to the selected wordlines, bitlines and sourcelines. Examples for these voltages are given in U.S. Ser. No. 08/624,322 filed on Mar. 29, 1996.

Figure 2A:
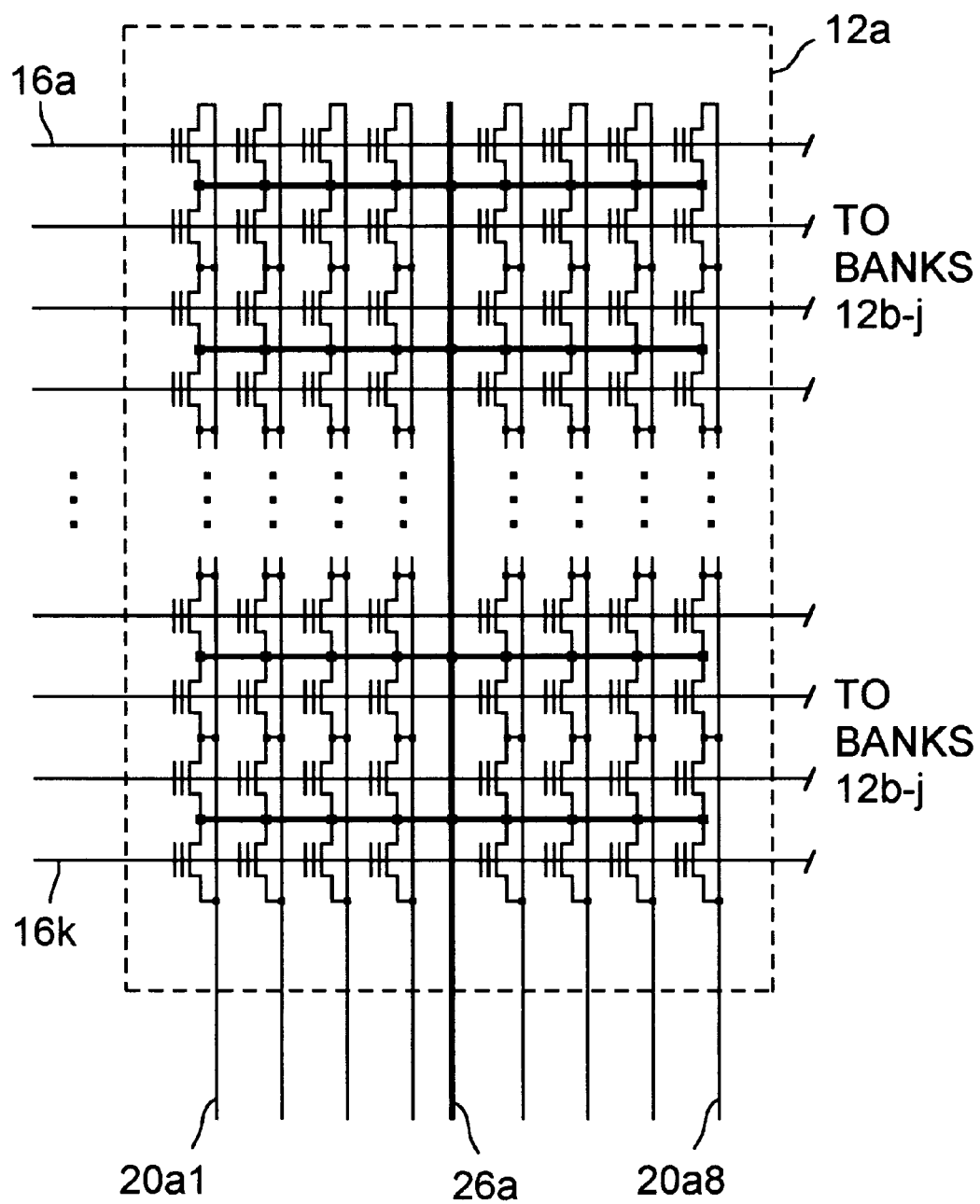
FIGS. 2A–E depict various flash memory banks that can be employed in the embodiment depicted in FIG. 1.
Figure 2B:
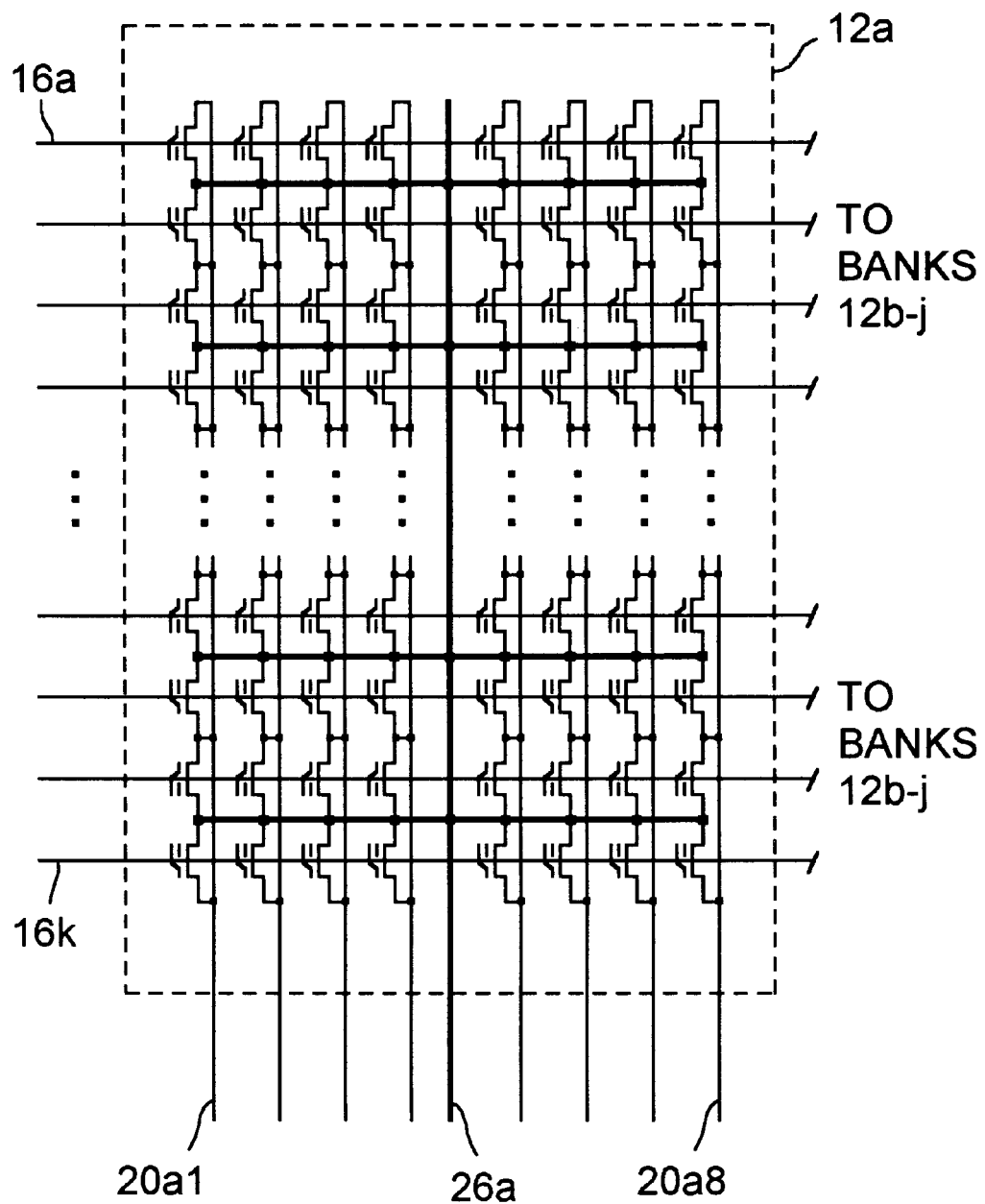
Figure 2C:
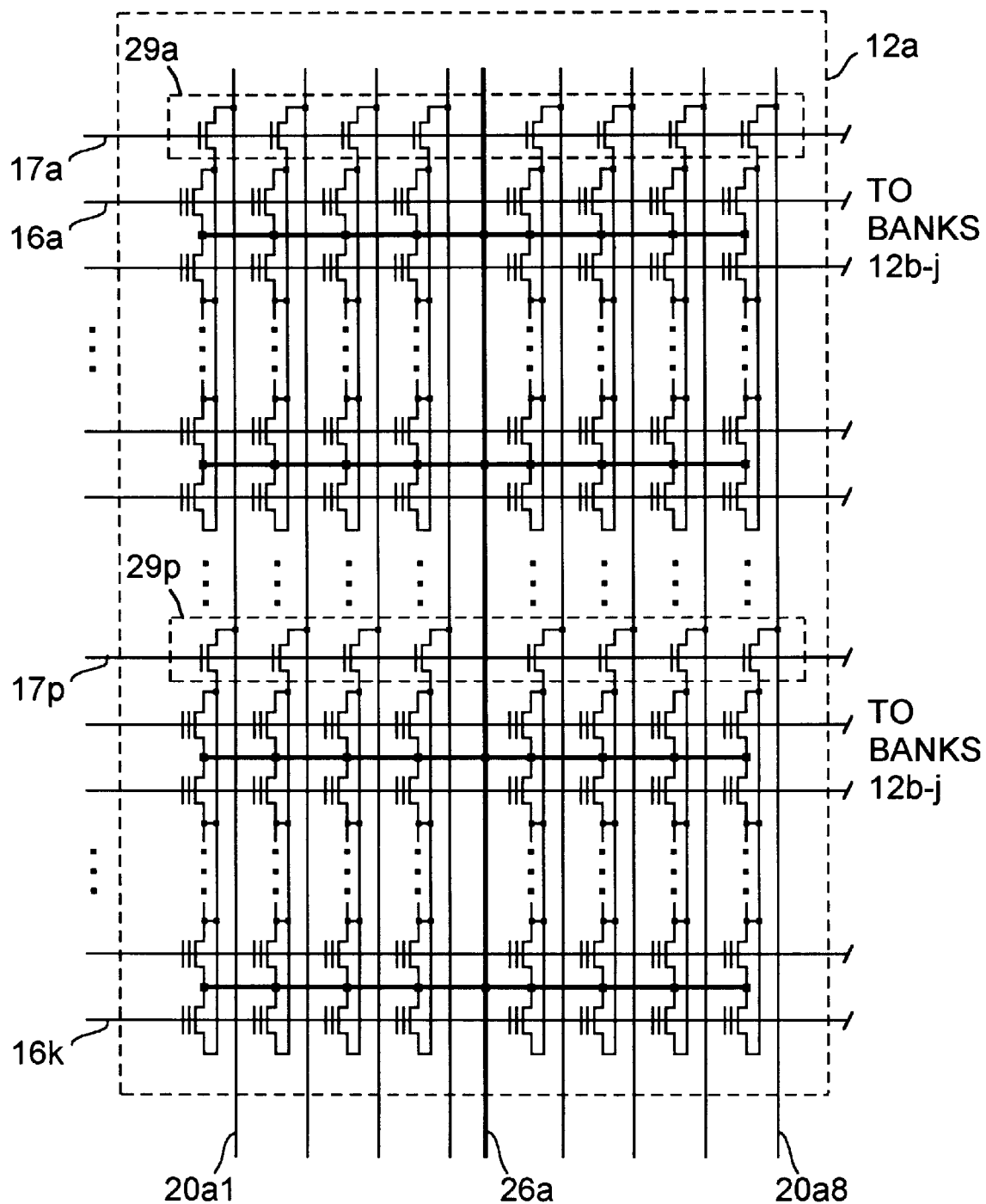
Figure 2D:
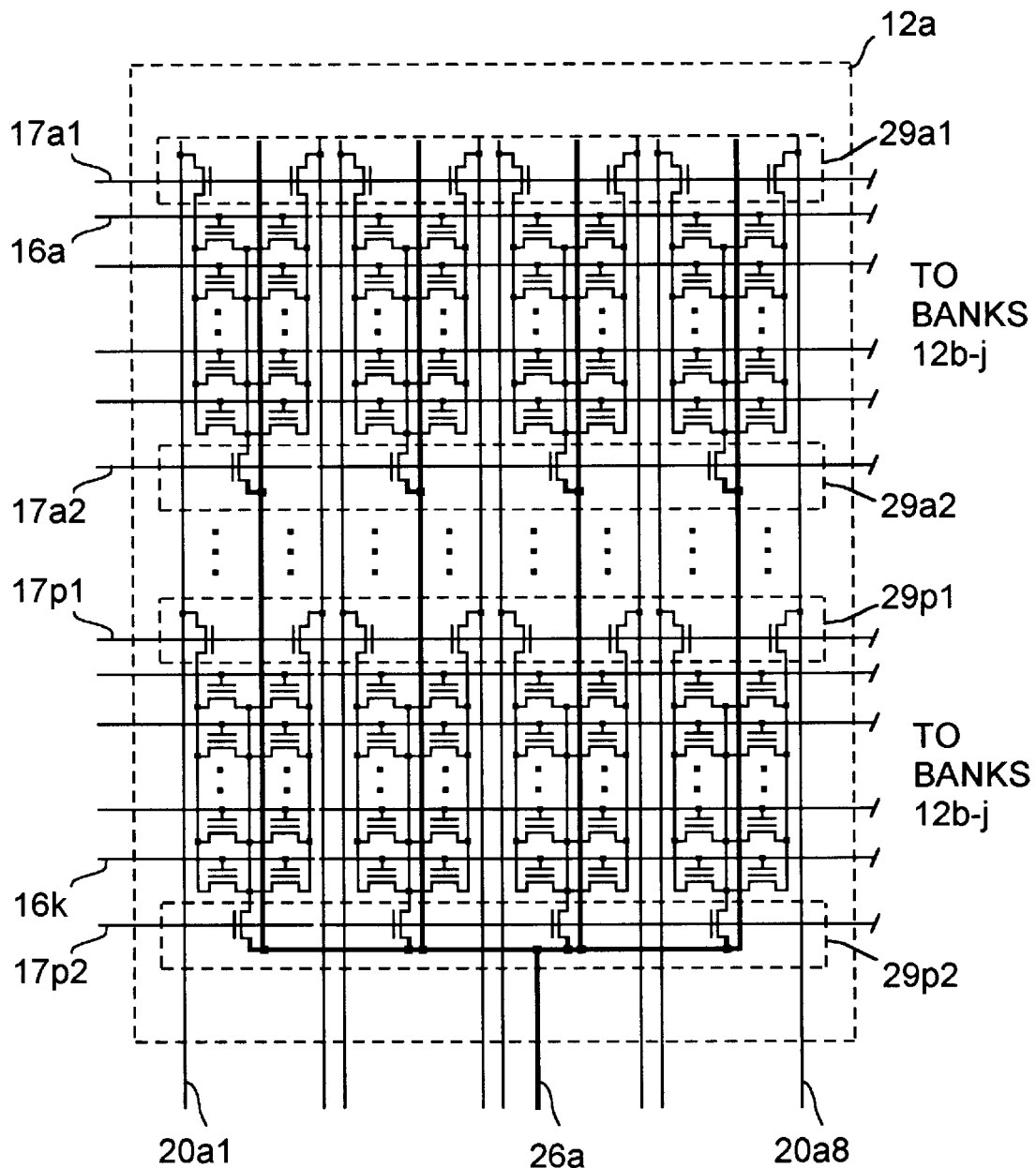
Figure 2E:
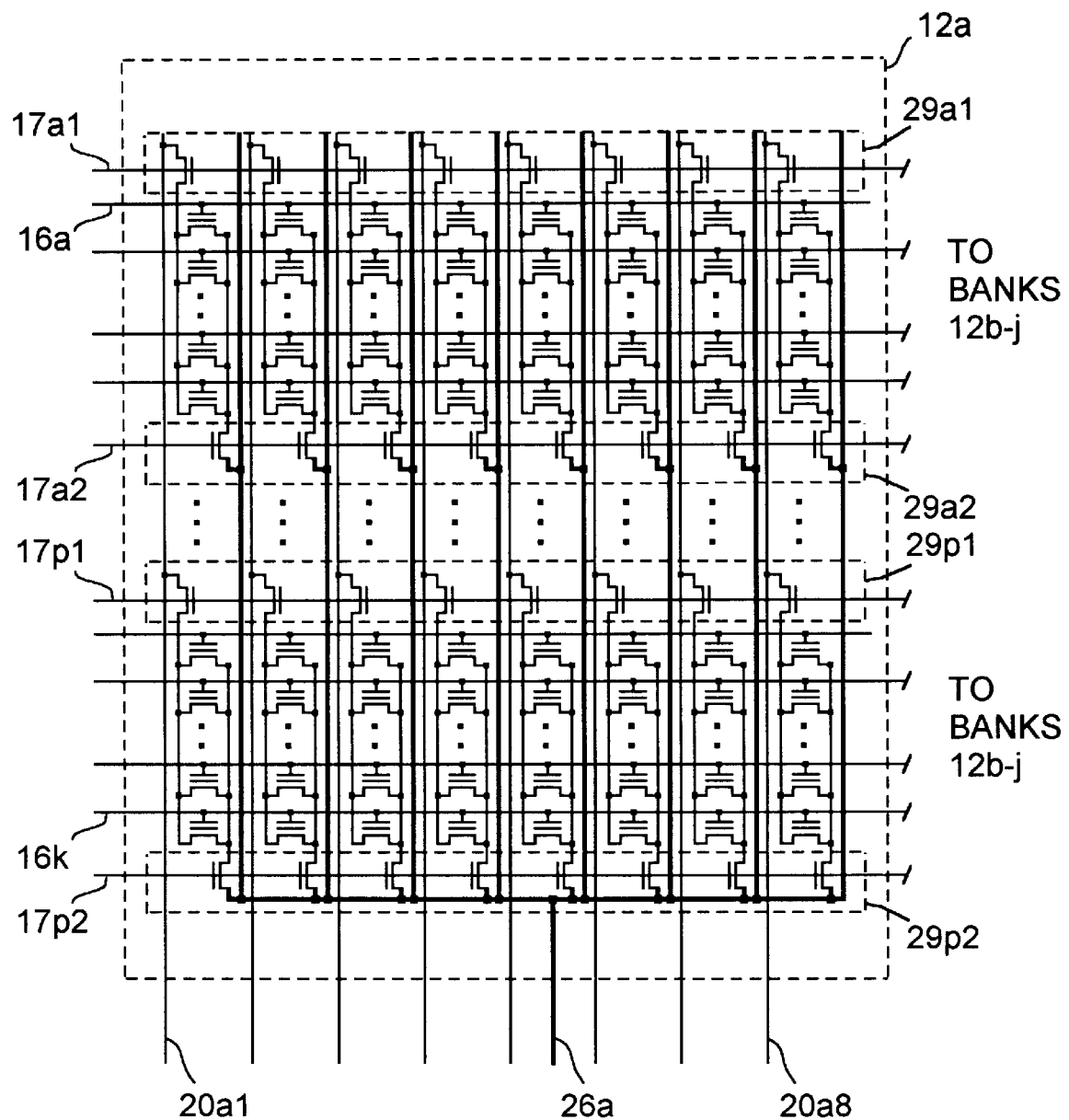

FIGS. 2A–E depict various flash memory banks that can be employed in the embodiment depicted in FIG. 1. Since the architecture of FIG. 1 has a divided sourceline, each of the FIGS. 2A–E depict a portion of the divided sourceline architecture, which allows for individual selection of the sourcelines 26a–26j. In the FIGS. 2A–E the sourceline is divided into groups of single bytes (8 bits), but can also be divided into double bytes (16 bits), quadruple bytes (32 bits) or other number of bytes or bits. FIG. 2A depicts a bank of ETOX type flash transistors that are configured into a NOR array and that constitute the bank. ETOX is a brand name of Intel Corporation, and stands for electrically tunneling oxide. FIG. 2B depicts a bank of split-gate type flash transistors that constitute the bank. FIG. 2C depicts a bank of flash transistors with a set of control lines 17a–17p that control pass transistors 29a–29p. Each group of flash transistors is accessed through the pass transistors 29a–29p. When a control line 17a–17p is activated a respective group of flash transistors is coupled to the bitlines 20a1–20a8. When such a transistor bank is employed, the wordline decoder is modified to include a decoder for control lines 17a–17p. FIG. 2D depicts a bank of flash transistors with a dual-string configuration and set of control lines 17a–17p that control pass transistors 29a–29p. The dual-string configuration has a divided bitline structure that allow four groups of eight bitlines 20a1–20a8 to share one divided sourceline. FIG. 2E depicts a bank of flash transistors that are configured into an AND array and selected by a set of control lines 17a–17p that control pass transistors 29a–29p.

B. Memory Operation

Figure 3:
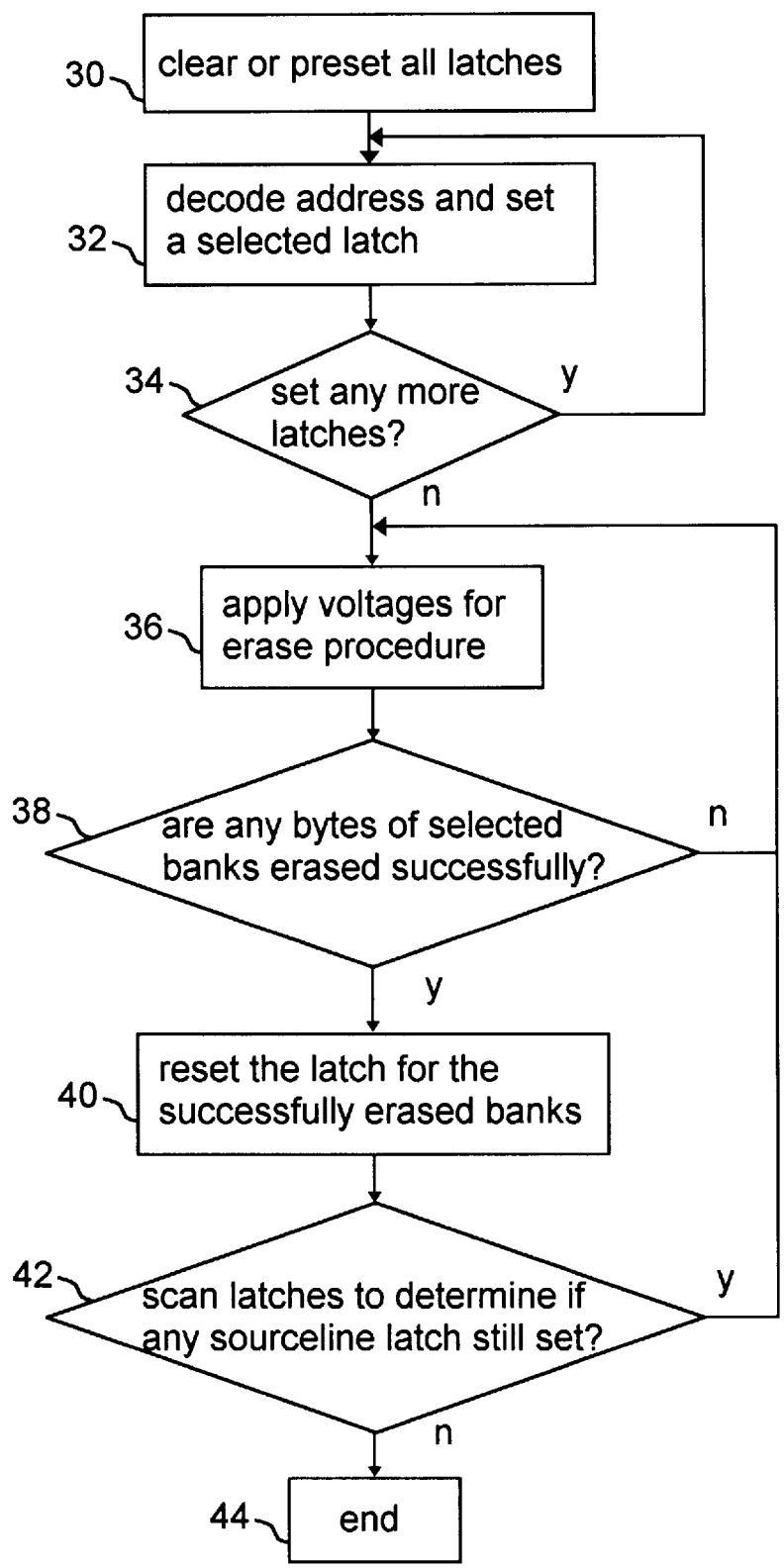
FIG. 3 is a flowchart showing an erase procedure performed on the flash memory of FIG. 1.

FIG. 3 is a flowchart showing an erase procedure using the latch 24. In step 30, all the latches are cleared or preset. In step 32, the bitline address is decoded in order to identify and set a selected latch. In step 34, the procedure determines whether additional latches are to be set and if so, step 32 is repeated. If not, step 36 applies the voltages for the erase or program procedure. Examples for these voltages are given in U.S. Ser. No. 08/624,322 filed on Mar. 29, 1996. For a typical erase procedure, the sourceline voltage is VDD (+5 V), the bitline is floating and the wordline voltage is VNN (−10 V). Step 38 then verifies the erase procedure by checking whether there are any bytes in selected banks that are successfully erased, and if not, step 36 is repeated. If so, step 40 resets the latch for the successfully erased bank. Step 42 then scans the latches to determine whether any latches are still set and if so, returns the procedure to step 36. If not, step 44 ends the procedure. In the exemplary embodiment, the latches are each reset upon an erase verification, but can also be reset by other functions such as a read procedure.

Figure 4:
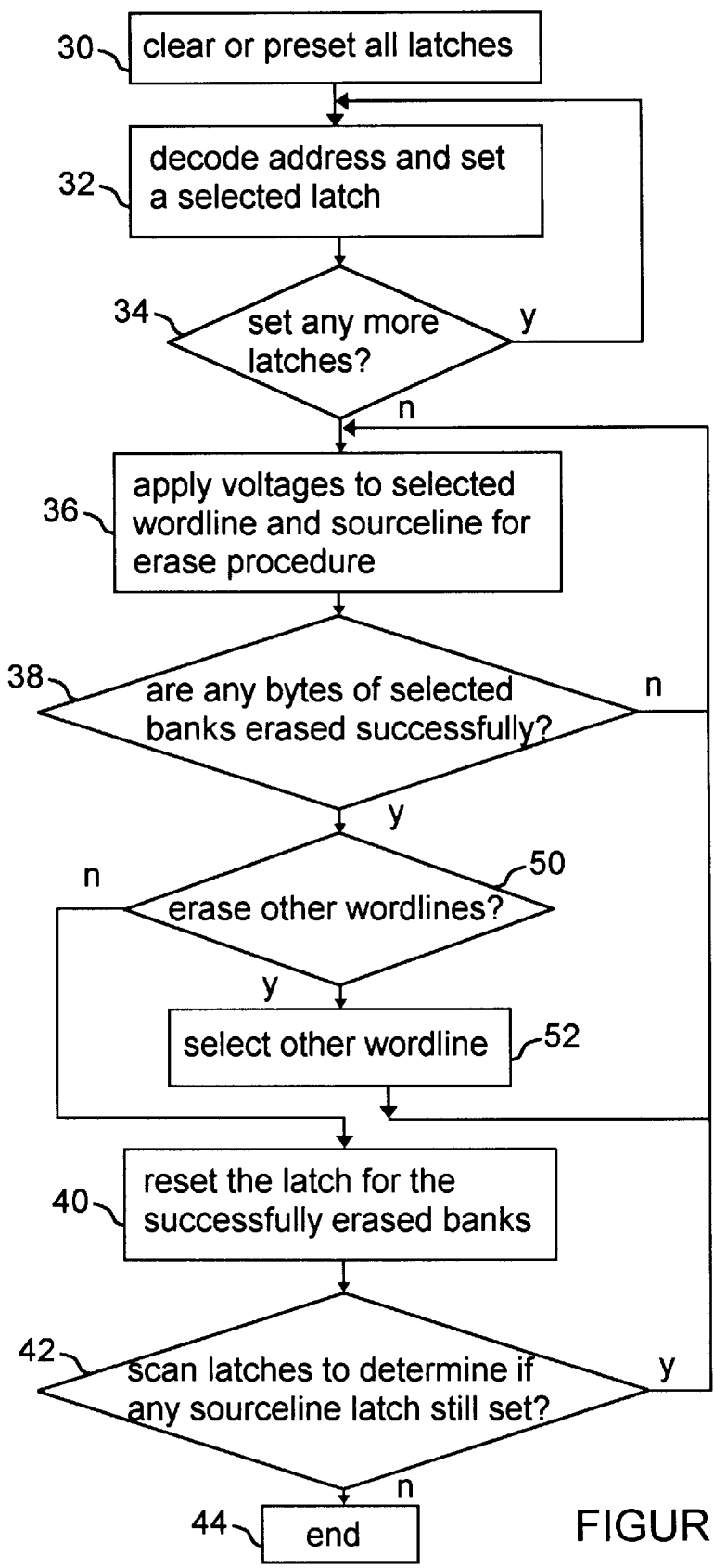
FIG. 4 is a second flowchart showing an erase procedure performed on the flash memory of FIG. 1.

FIG. 4 is a flowchart showing a multiple wordline erase procedure for each latch operation. The commonly numbered steps are the same as in FIG. 2. The additional steps are 50 and 52. In step 50, a determination is made whether to areas additional wordlines (e.g. bytes) in the selected block that already has a latch applied. If not, then step 40 is performed as in FIG. 3. If so, step 52 selects the additional wordline that needs to be erased and returns the processing to step 36 where erase voltages are applied.

Another technique is incorporated by reference from U.S. Ser. No. 081645,630 filed on May 14, 1996 (Atty Docket No. A-63360) where the wordline decoder 14 includes a plurality of wordline latches that can simultaneously latch a plurality of randomly selected wordlines. This technique allows the memory to simultaneously erase a plurality of wordlines (e.g. bytes) in a selected bank.

C. Flash Memory Bank Architectures

Figure 5:
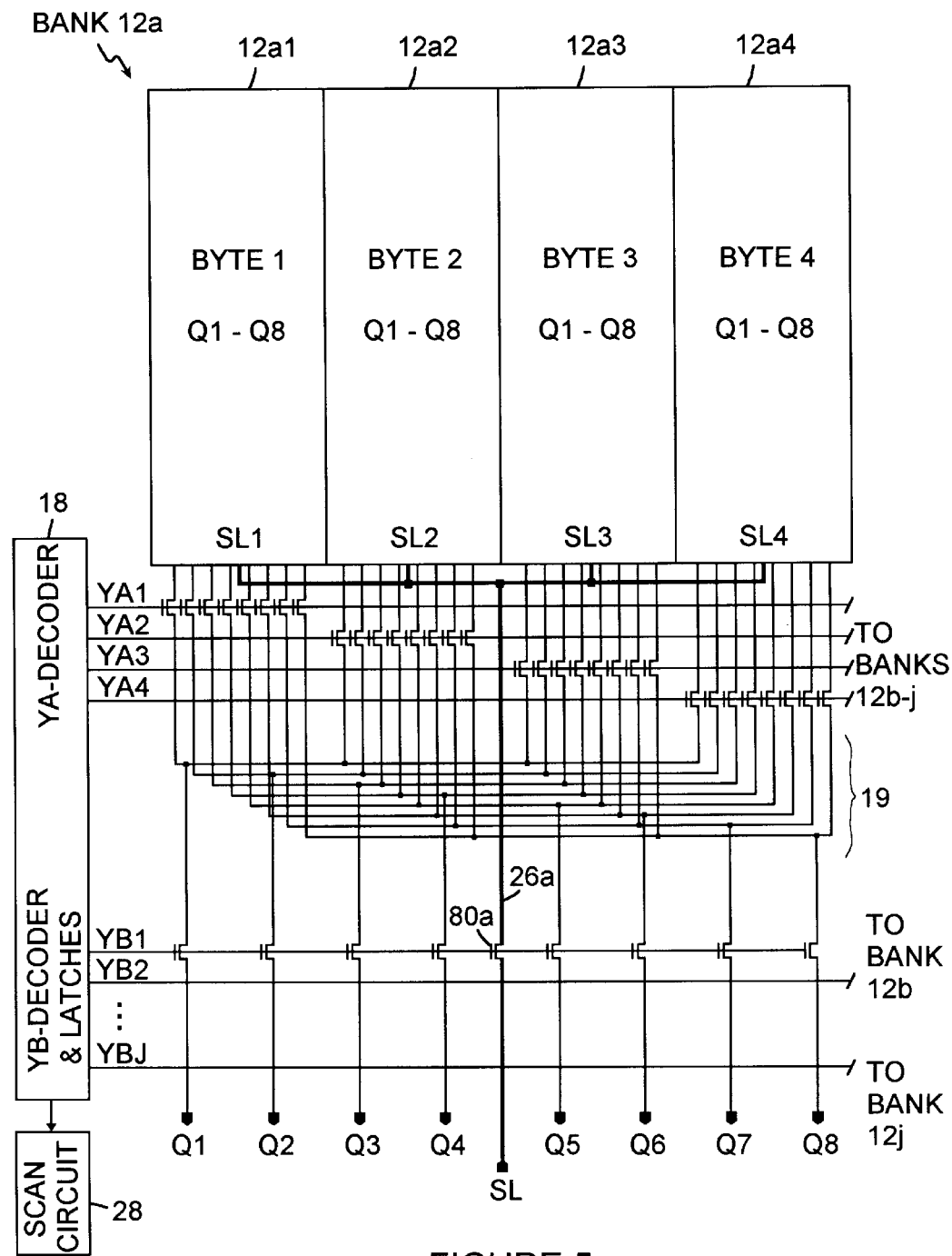
FIG. 5 depicts an implementation of a flash memory bank according to an embodiment of the invention.

FIG. 5 depicts an implementation of a flash memory bank according to an embodiment of the invention. Bank 12a is divided into 4 sub-banks 12a1–12a4. Sub-bank 12a1 includes a word of 8 bits (a byte). For a read procedure from subbank 12a1, for example, the bitline and sourceline decoder 18 activates lines YA1 and YB1, the bitlines associated with bank 12a1 are coupled to the terminals Q1–Q8, and a word from sub-bank 12a1 is read by the sense amplifier. Similarly, a read procedure from sub-bank 12a2 is accomplished by activating lines YA2 and YB1, from sub-bank 12a3 is accomplished by activating lines YA3 and YB1, and from sub-bank 12a4 is accomplished by activating lines YA4 and YB1. The voltages for the read procedure are known in the art and the sourceline voltage is typically VSS (ground).

For an erase procedure, the sourceline voltage is typically positive such as VDD (+5 V), the bitline is floating and the wordline voltage is VNN (−10 V). When the erase signal is asserted to the bitline and sourceline decoder, the common sourceline is set to VDD. A number of pass transistors 80a–80j, each one associated with each bank, determine whether the erase voltage is asserted in the bank. In FIG. 5, pass transistor 80a is activated by line YB1, which determines whether an erase procedure is performed on a portion, or all, of bank 12a. If line YB1 is asserted with VPP (+10 V), YA1–YA4 are grounded (VSS) to float 32 bitlines of Byte1-Byte4, and then the erase voltage VDD (+5 V) is asserted on line 26a in the bank 12a. If the latch 24 is set for the line YB1 then the erase voltage is sustained on sourceline 26a.

Banks 12a–12j are similarly constructed and if the respective lines YBa–YBj are asserted then respective pass transistors 80a–80j are activated and portions of respective banks 12a–12j are set to be erased. If more than one bank is desired to be erased, the latch 24 is employed to latch the lines YB1–YBj in order to continuously assert the lines YB1–YBj. When a plurality of lines YB1–YBJ are asserted, a plurality of sourcelines 26a–26j are activated with an erase voltage (VDD). A latch for such purpose is described below under the heading Latch Structure.

The minimum erase size in FIG. 5 is four bytes (32 bits). To perform the erase, the sourceline 26a is activated by line YB1, the bitlines are floated by grounding lines YA1–YA4 and wordline decoder 14 activates a selected wordline.

Figure 6:
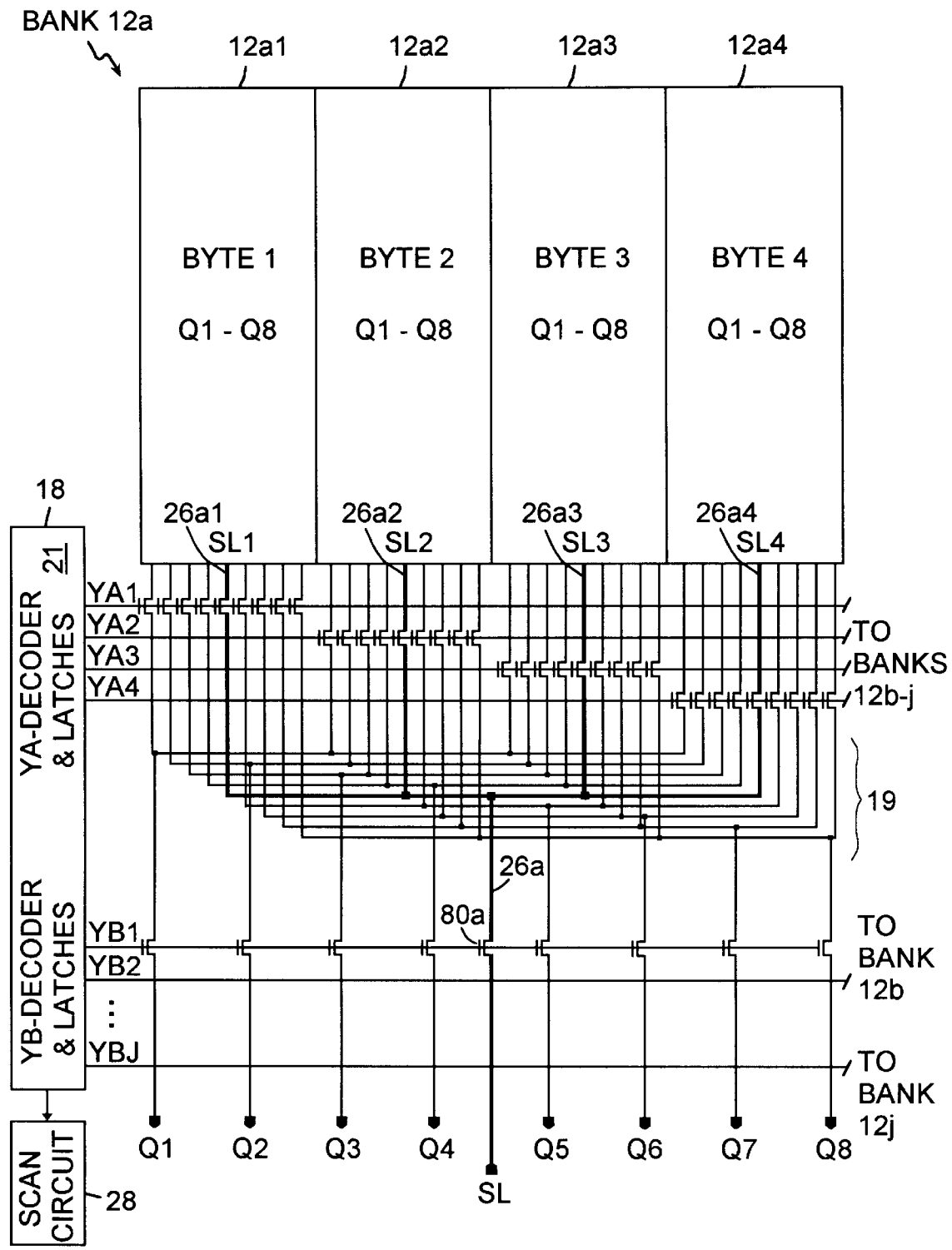
FIG. 6 depicts an implementation of a flash memory bank according to an embodiment of the invention.

FIG. 6 depicts a modification of FIG. 5 that includes a YA latch 21 in bitline and sourceline decoder 18. This further division of the sourceline allows smaller portions of the bank 12a to be selectively erased. For example, if sub-bank 12a1 is to be erased, line YAI will be activated allowing sourceline 26a1 to be coupled to the sourceline 26a and providing the sourceline erase voltage to sub-bank 12a1. A YA latch 21 further provides a latch function for lines YA1–YA4. This latch 21 allows the bitline selection to be sustained for an erase procedure. With this technique, one, two, three or four bytes can be selected for the erase procedure. In order to float the bitlines in this embodiment, signals Q1–Q8 are floated.

The minimum erase size of FIG. 6 is one byte due to the YA latch 21. As an example, assume Byte 1 is desired to be erased. Then YA1 is asserted to VPP (+10 V) thereby coupling line 26a 1 to line 26a. YB1 is asserted to VPP (+10 V) and sourceline 26a is connected to receive VDD (+5 V).

Q1–Q8 are floated. In this manner only the selected sourceline 26a1 in Byte 1 is connected to the sourceline erase voltage VDD (+5 V), while the rest of the sourcelines 26a2–26a4 and bitlines in Byte2-Byte4 are grounded via a Y-MUX circuit 23 within Y selector 19 that has a reverse logic to the Y selector circuit. The Y-MUX circuit is used to ground the non-selected bitlines and sourcelines, as known in the art. If two or more YA lines are asserted simultaneously (latched) then the minimum erase size is increased accordingly at one byte per additional asserted YA line.

Figure 7:
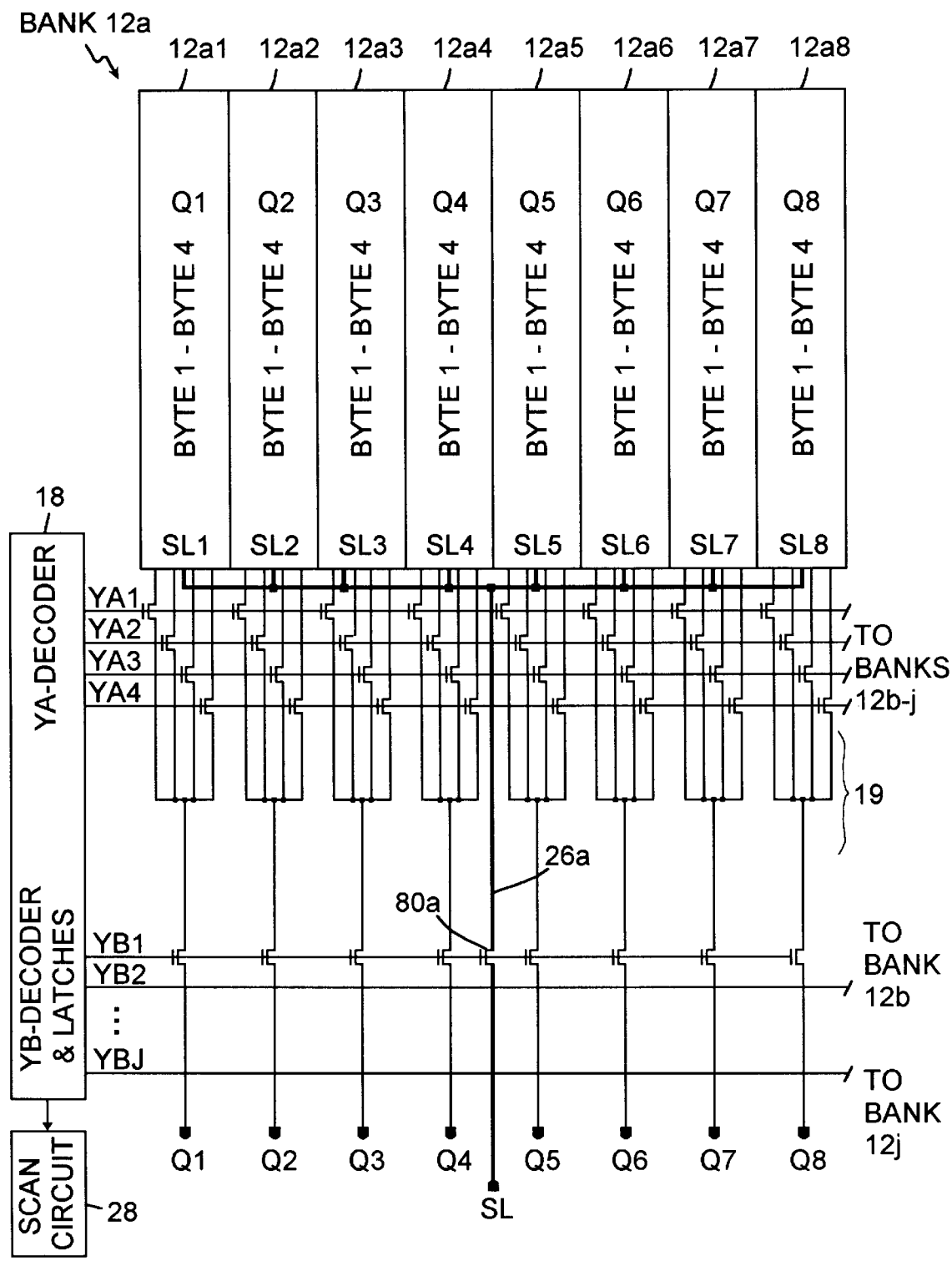
FIG. 7 depicts an implementation of a flash memory bank according to an embodiment of the invention.

FIG. 7 depicts an alternate implementation of a flash memory bank. Each of the sub-banks 12a1–12a8 store 4 bits. The first bits of each sub-bank are combined by selecting lines YAI and YB1 to compose a word (e.g. a byte) Q1–Q8. This configuration of combining portions of the sub-banks 12a1–12a8 to form a word is called a logical sub-bank. In FIG. 7 there are four logical sub-banks each selected by one of lines YA1–YA4. YA1 selects the logical sub-bank of the first bits from each physical sub-bank 12a1–12a8. YA2 selects the logical sub-bank of the second bits from each physical sub-bank 12a1–12a8. YA3 selects the logical sub-bank of the third bits from each physical sub-bank 12a1–12a8. YA4 selects the logical sub-bank of the fourth bits from each physical sub-bank 12a1–12a8.

The minimum erase size of FIG. 7 is four bytes since the sourceline 26a provides the erase voltage to all of sub-banks 12a1–12a8 simultaneously. In the erase procedure, YA1–YA4 are grounded and 32 bitlines of sub-banks 12a1–12a8 are floating. YB1 is asserted to VPP (+10 V) and the sourceline 26a is asserted with VDD (+5 V). The embodiment of FIG. 7 can be modified such that any number of bits can be stored in each of the physical sub-banks 12a1–12a8 and any number of sub-banks can be constructed and associated together to form the logical sub-banks.

Banks 12a–12j are similarly constructed and if the respective lines YBa–YBj are asserted then respective pass transistors 80a–80j are activated and portions of respective banks 12a–12j are set to be erased. If more than one bank is desired to be erased, the latch 24 is employed to latch the lines YB1–YBj in order to continuously assert the lines YB1–YBj. When a plurality of lines YB1–YBJ are asserted, a plurality of sourcelines 26a–26j are activated with an erase voltage. A latch for such purpose is described below under the heading Latch Structure.

Figure 8:
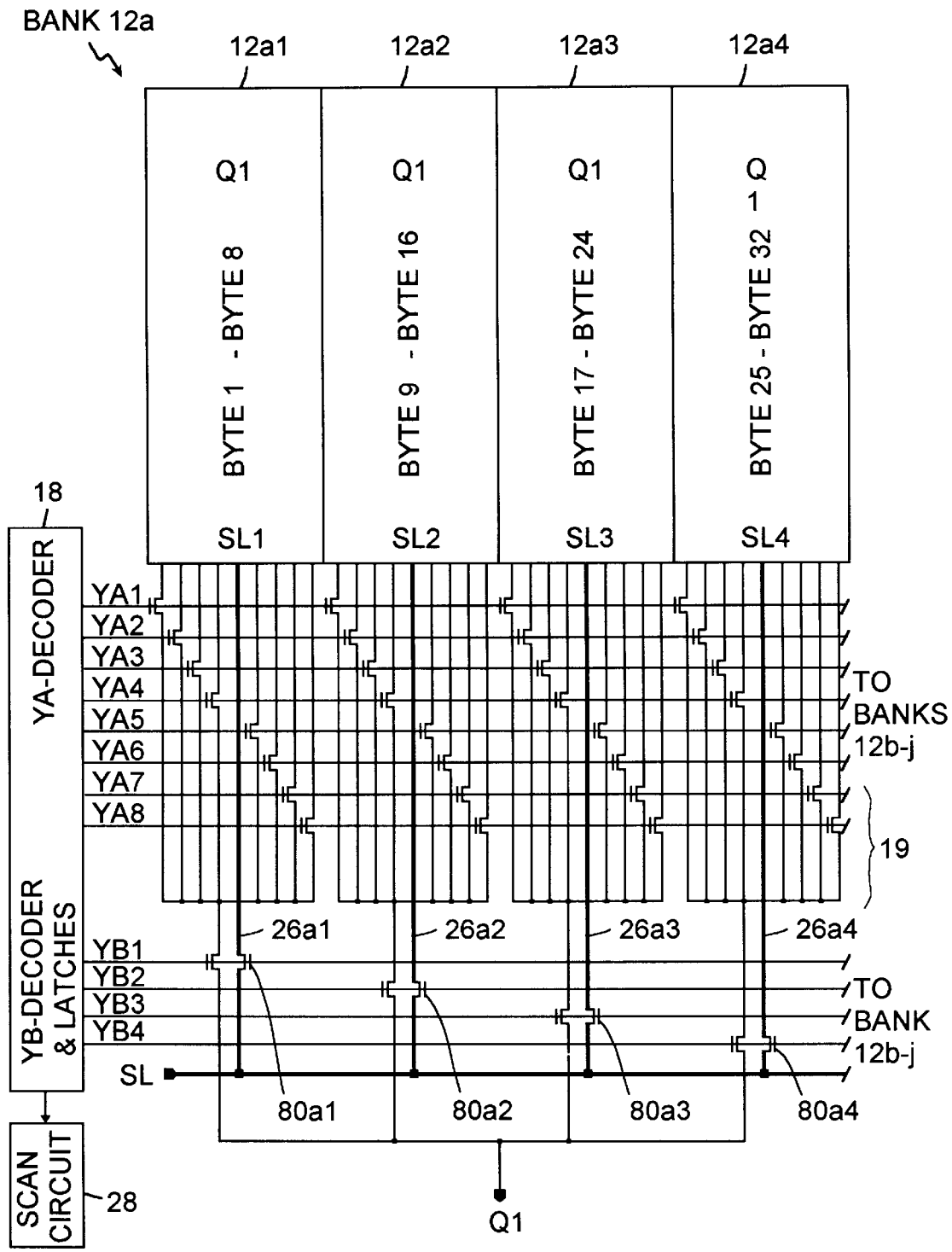
FIG. 8 depicts an implementation of a flash memory bank according to an embodiment of the invention.

FIG. 8 depicts an alternate implementation of a flash memory bank having two levels of bit selection. This implementation is designed to provide one portion (e.g. a bit) of a word. Each of the sub-banks 12a1–12a4 stores 8 bits. The first bits of each sub-bank are selected by line YA1. The first sub-bank is selected by line YB1. In order to compose a word (e.g. a byte) bits from different banks 12a–12j are combined together. For example, bank 12a provides bit Q1 while bank 12b provides bit Q2, bank 12c provides bit Q3 and so on until the word is completed. This configuration of combining portions of the physical banks 12a–12j to form a word is called a logical bank. In FIG. 8 there are portions (bits) of 32 logical banks each selected by one of lines YA1–YA8 and lines YB1–YB4. For example, YA1 selects the logical sub-bank of the first bits from each physical sub-bank 12a1–12a4 and YB1 selects the logical bank of the logical sub-banks 12a1–12a4 to form the logical bank.

The minimum erase size of FIG. 8 is eight bytes since the YB decoder selects the logical sub-bank of eight bytes simultaneously. For example line YB1 selects sub-bank 12a1, 12b1, 12c1 to 12j1. Each of the sub-banks is simultaneously supplied with the sourceline erase voltage through transistors 80a1, 80b1, 80c1 to 80j1. Thus, the minimum erase size is a function of the number of banks 12a–12j, in this example eight. In the erase procedure, YA1–YA8 are grounded and 8 bitlines of sub-bank 12a1 are floating. Also, eight bitlines of the other sub-banks 12b1, 12c1 to 12j1 are also floating. YB1 is asserted to VPP (+10 V) and the sourceline 26a1 is asserted with VDD (+5 V). In this manner only the selected sourceline 26a1 in Byte 1 to Byte 8 is connected to the sourceline erase voltage VDD (+5 V), while the rest of the sourcelines 26a2–26a4 and bitlines in Byte 9 to Byte 32 are grounded via a Y-MUX circuit 23 within Y selector 19 that has a reverse logic to the Y selector circuit 19. The Y-MUX circuit is used to ground the non-selected bitlines and sourcelines, as known in the art. A YA latch 21 can be added to provide a latch function similar to that of FIG. 6. This would provide further flexibility to erase selected portions of memory. The embodiment of FIG. 8 can be modified such that any number of bits can be stored in each of the physical sub-banks 12a1–12a4 and any number of sub-banks can be constructed and associated together to form the logical sub-banks and logical banks.

Banks 12a–12j are similarly constructed and when the lines YBa–YBj are asserted then respective pass transistors 80a1–80j4 are activated and portions of respective banks 12a–12j are set to be erased. If more than one logical bank is desired to be erased, the latch 24 is employed to latch the lines YB1–YBj in order to continuously assert the lines YB1–YBj. When a plurality of lines YB1–YBj are asserted, a plurality of sourcelines 26a–26j are activated with an erase voltage. A latch for such purpose is described below under the heading Latch Structure.

For any of the embodiments depicted in FIGS. 5 to 8, a program procedure is performed similar to the erase procedure. In the program procedure, program voltages are applied to the selected wordlines, bitline and sourcelines. Examples of such voltages are described in U.S. Ser. No. 08/624,322 filed on Mar. 29, 1996. The difference between erase and program is the voltage on the sourceline. For an erase procedure the sourceline voltage is typically VDD (+5 V) while for an erase procedure the sourceline voltage is typically VSS (ground). The erase wordline voltage is typically VNN (−10 V) while the program wordline voltage is typically VPP (+10 V).

D. Latch Structure

Figure 9:
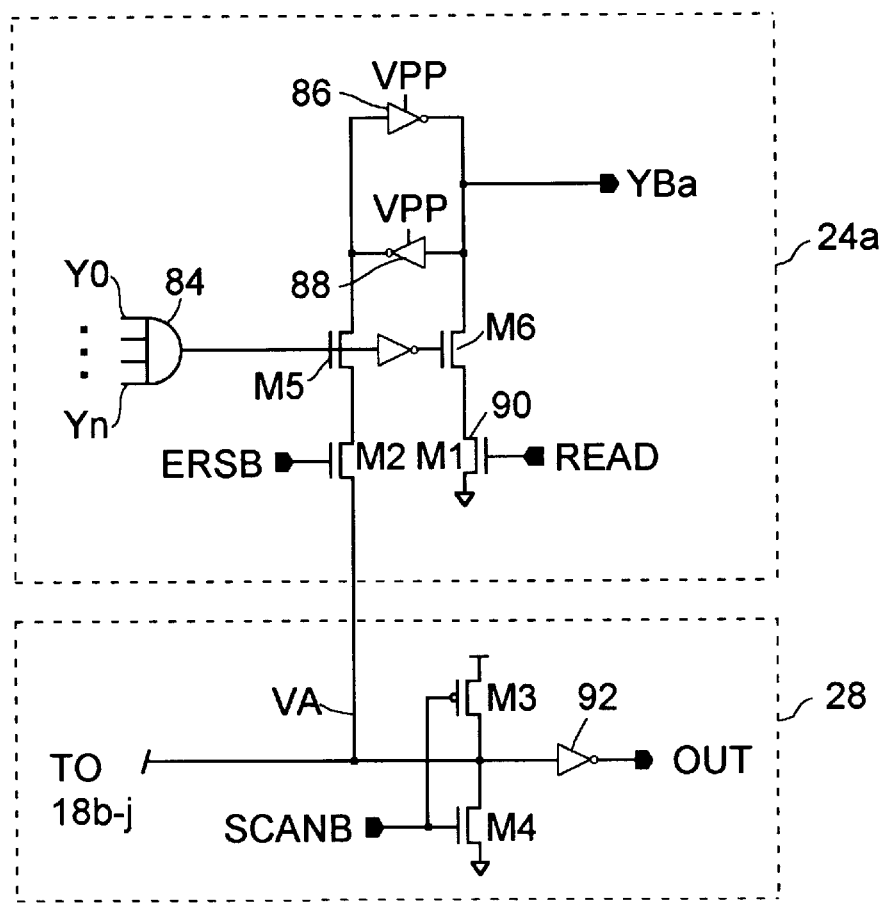
FIG. 9 depicts a latch according to an embodiment of the invention.

FIG. 9 depicts a latch according to an embodiment of the invention. The exemplary embodiment employs one latch 24a for each line YB1–YBj although fewer can be employed with a collective decoding technique. Exemplary latch 24a includes an AND gate 84 with address inputs Y0–Yn. The latch includes two invertors 86 and 88 with power coupled to VPP (+10 V). Since these invertors provide their outputs to one another they perform a latch function. The latch function is reset when an external signal overrides the latched signal. A level shifter 90 coupled to the invertors 86 and 88 is used to shift the output voltage on line YBa when necessary.

Table 1 accompanies FIG. 9 and shows the voltages applied for the set, reset, erase, scan and read procedures. To set the latch 24a, ERSB is high, READ is low and SCANB is high. When the address Y0–Yn is asserted to AND gate 84, the AND gate asserts a high signal turning M5 on and M6 off. This permits the low signal from M4 to be applied to invertor 86 and set line Yba high.

To reset the latch 24a, ERSB is high, READ is low and SCANB is low. When the address Y0–Yn is asserted to AND gate 84, the AND gate asserts a high signal turning M5 on and M6 off. This permits the high signal from M3 to be applied to invertor 86 and set line Yba low.

To erase, ERSB is low, READ is low and SCANB is don't care. This isolates the invertors 86 and 88 and prevents the latch setting from changing. Then the erase voltage is applied and the selected flash memory portions are erased.

A scan procedure can be performed during the erase procedure to determine which of the latches are set. For a scan procedure, ERSB is high, READ is low and SCANB is low. In this procedure, the address input Y0–Yn is incremented through all the possible addresses, or through a portion of desired addresses to scan. Address input Y0–Yn selects AND gate 84 to turn transistor M5 on and transistor M6 off. The latch invertors 86 and 88 will provide a signal to invertor 92 that is opposite to the line YBa. Invertor 92 inverts the signal again and provides a signal on line OUT that is the same as line YBa. The next address is then provided to AND gate 84 and the next latch is checked. In this manner all the lines YB1–YBj are scanned and checked for their respective latch status.

To read the memory, ERSB is high, READ is high and SCANB is high. When the address Y0–Yn is asserted to AND gate 84, the AND gate asserts a high signal turning M5 on and M6 off. This permits the low signal from M4 to be applied to invertor 86 and set line Yba high. Then the addressed memory portion is read. When the address Y0–Yn is deasserted to AND gate 84, the AND gate deasserts the high signal turning M5 off and M6 on. Since READ is high, the low signal from M1 pulls Yba low.

E. Voltage and Current Pumps

The disclosed embodiments assume that all necessary power levels are supplied. However, the disclosed embodiments can be combined with a charge or voltage pump generator to increase the voltage beyond that supplied, i.e. from VDD to VPP. Charge and voltage pumps are known in the art and example is given by way of reference to U.S. Pat. Nos. 4,679,134 and 4,812,961. The incorporation of a pump generator with the exemplary embodiments expands the operational voltages in order to facilitate improved yield and reliable retrieval of stored values.

For example, if the memory is supplied with VDD(+3.3 V), and needs VPP(+10 V) and VNN (−10 V) and other voltages such as +5 V, the voltage pump generator creates the needed voltage and provides it to the decoder circuits to accomplish the necessary function.

F. Conclusion

The invention provides many advantages over known techniques. As a result of the novel memory architecture, a flexible number of bytes can be selected for erasure. The selected number of bytes can range from one byte to 64K bytes or more. Moreover, the invention reduces erase/write cycle time, improves expected lifetime of the flash memory due to reduced stress on the flash transistors within the flash memory, and reduces power consumption. Furthermore, the addition of a scan circuit reduces the number of times that the flash transistors experience stressful erase voltages thereby further increasing the flash memory life. Flash memories incorporating the invention can be constructed using any size array such as a 16×32, 1K×1K, 1K×2K, or N×M array.

Having disclosed exemplary embodiments and the best mode, modifications and variations may be made to the disclosed embodiments while remaining within the scope of the invention as defined by the following claims.

What is claimed is:

1. A flash memory comprising:
   a first bank of flash transistors forming a plurality of rows and a plurality of columns, and having wordlines, bitlines and a first sourceline;

a second bank of flash transistors forming a plurality of rows and a plurality of columns, and having wordlines, bitlines and a second sourceline;

a wordline decoder coupled to said wordlines and configured to receive a wordline address signal and to decode said wordline address signal to select a wordline; and a bitline and sourceline decoder coupled to said bitlines, said first sourceline and said second sourceline and configured to receive a bitline address signal and to decode said bitline address signal to select predetermined bitlines and at least one sourceline, said bitline and sourceline decoder including a latch configured to latch a selected sourceline to selectively provide a sourceline erase voltage on said selected sourceline.

2. The flash memory of claim 1, wherein:

said wordline decoder is configured to provide a wordline erase voltage on a selected wordline in response to an erase signal, said bitline and sourceline decoder is configured to float selected bitlines in response to said erase signal, and said latch is configured to sustain said sourceline erase voltage on said selected sourceline in response to said erase signal.

3. The flash memory of claim 2, wherein:

said latch is configured to reset in response to a read signal.

4. The flash memory of claim 2, wherein:

said wordline decoder is configured to provide a wordline erase voltage on all wordlines in response to an erase all signal, said bitline and sourceline decoder is configured to float all bitlines in response to said erase all signal, and said latch is configured to provide said sourceline erase voltage on all sourcelines in response to said erase all signal.

5. The flash memory of claim 2, wherein:

said latch is configured to reset in response to a read signal, and said wordline latch is configured to reset in response to a read signal.

6. The flash memory of claim 1, further comprising:

a scan circuit coupled to said bitline and sourceline decoder and configured to selectively scan through said latch to determine the state of said latch.

7. The flash memory of claim 1, further comprising:

a wordline latch coupled to said wordlines and configured to latch a selected wordline to selectively provide a wordline erase voltage on said selected wordline.

8. The flash memory of claim 7, wherein:

said wordline latch is configured to provide a wordline erase voltage on said selected wordline in response to an erase signal, said bitline and sourceline decoder is configured to float selected bitlines in response to said erase signal, and said latch is configured to provide said sourceline erase voltage on said selected sourceline in response to said erase signal.

9. The flash memory of claim 8, wherein:

said wordline latch is configured to provide a wordline erase voltage on all wordlines in response to an erase all signal, said bitline and sourceline decoder is configured to selectively float all bitlines in response to said erase all signal, and said latch is configured to provide said sourceline erase voltage on all sourcelines in response to said erase all signal.

10. A method of performing a procedure in a flash memory having a first bank of flash transistors with a first sourceline, and a second bank of flash transistors with a second sourceline, said method comprising the steps of:

receiving an address of a word requested to be erased;

decoding said address to identify a word in one of said first bank and said second bank;

latching a sourceline corresponding to said identified word in one of said first bank and said second bank; and in response to an erase signal, performing the steps of:
(a) providing a wordline erase voltage to gates of transistors for said identified word;
(b) floating bitlines to drains of said transistors for said identified word; and
(c) providing a sourceline erase voltage to said latched sourceline.

11. The method of claim 10, further comprising the step of:

in response to a read signal, resetting said latched sourceline.

12. The method of claim 10, further comprising the step of:

in response to an erase all signal, performing the steps of:
(a) providing a wordline erase voltage to gates of all transistors;
(b) floating bitlines to drains of all transistors; and
(c) providing a sourceline erase voltage to all sourcelines.

13. The method of claim 10, further comprising the step of:

selectively scanning the latch to determine the state of the latch.

14. The method of claim 10 where said flash memory further has a third bank of flash transistors with a third sourceline, said method further comprising the steps of:

receiving a second address of a second word requested to be erased;

decoding said second address to identify a second word in one of said second bank and said third bank;

latching a second sourceline corresponding to said second identified word in one of said second bank and said third bank; and in response t o said erase signal, performing the steps of:
(a) providing a wordline erase voltage to gates of transistors for said second identified word;
(b) floating bitlines to drains of said transistors for said second identified word; and
(c) providing a sourceline erase voltage to said second latched sourceline.

15. The method of claim 14, further comprising the steps of:

latching a wordline corresponding to said identified word in one of said first bank and said second bank; and latching a second wordline corresponding to said second identified word in one of said second bank and said third bank.

16. The method of claim 15, further comprising the step of:

in response to a read signal, resetting said latched sourcelines and resetting said latched wordlines.

17. The method of claim 14, further comprising the step of:

selectively scanning the latch to determine the state of the latch.

18. A flash memory comprising:

a first bank of flash transistors forming a plurality of rows and a plurality of columns, and having wordlines, bitlines and a first sourceline;

a second bank of flash transistors forming a plurality of rows and a plurality of columns, and having wordlines, bitlines and a second sourceline;

a wordline decoder coupled to said wordlines and configured to receive a wordline address signal and to decode said wordline address signal to select a wordline;

a bitline and sourceline decoder configured to receive a bitline address signal and to decode said bitline address signal and to assert at least one of a plurality of bitline and sourceline select lines, said bitline and sourceline decoder including a latch configured to selectively latch at least one of said bitline and sourceline select lines; and a Y selector coupled to said bitline and sourceline select lines, said bitlines, said first sourceline and said second sourceline and configured to receive a signal on each of said bitline and sourceline select lines to select predetermined bitlines and at least one sourceline.

19. The flash memory of claim 18, further comprising:

a scan circuit coupled to said bitline and sourceline decoder and configured to selectively scan through said latch to determine the state of said latch.

20. The flash memory of claim 18, further comprising:

a wordline latch coupled to said wordlines and configured to latch a selected wordline to selectively provide a wordline erase voltage on said selected wordline.

* * * * *